(12) United States Patent
Wikner

(10) Patent No.: US 7,595,673 B2
(45) Date of Patent: Sep. 29, 2009

(54) CLOCK SIGNAL GENERATOR

(75) Inventor: Jacob Wikner, Linkoping (SE)

(73) Assignee: Zoran Corporation, Sunnyvale, CA (US)

( * ) Notice: Subject to any disclaimer, the term of this patent is extended or adjusted under 35 U.S.C. 154(b) by 0 days.

(21) Appl. No.: 12/193,401

(22) Filed: Aug. 18, 2008

(65) Prior Publication Data

US 2009/0009225 A1    Jan. 8, 2009

Related U.S. Application Data

(63) Continuation of application No. PCT/EP2007/050507, filed on Jan. 18, 2007.

(30) Foreign Application Priority Data

Feb. 17, 2006    (EP) ................... 06110103

(51) Int. Cl.
   *H03L 7/06*    (2006.01)
(52) U.S. Cl. ............... 327/158; 327/269; 327/270; 327/276
(58) Field of Classification Search ........... 327/158, 327/269, 270, 276
   See application file for complete search history.

(56) References Cited

U.S. PATENT DOCUMENTS

| | | | | |
|---|---|---|---|---|
| 4,626,716 A | * | 12/1986 | Miki | ........................... 327/270 |
| 4,939,677 A | * | 7/1990 | Otuji et al. | .................. 702/125 |
| 5,646,564 A | * | 7/1997 | Erickson et al. | ............. 327/158 |
| 6,184,736 B1 | * | 2/2001 | Wissell et al. | ............... 327/295 |
| 6,664,837 B1 | | 12/2003 | Oh et al. | |
| 7,098,710 B1 | | 8/2006 | New et al. | |
| 7,319,351 B2 | * | 1/2008 | Zhang et al. | ................ 327/158 |
| 2003/0169085 A1 | | 9/2003 | Partsch et al. | |
| 2006/0091921 A1 | | 5/2006 | Park et al. | |

FOREIGN PATENT DOCUMENTS

JP    11017529    1/1999

OTHER PUBLICATIONS

International Search Report for corresponding Application No. PCT/EP2007/050507 mailed Oct. 2, 2007.
International Report on Patentability for corresponding Application No. PCT/EP2007/050507 mailed Oct. 2, 2007.

* cited by examiner

*Primary Examiner*—Tuan Lam
(74) *Attorney, Agent, or Firm*—Renner, Otto, Boisselle & Sklar, LLP

(57) ABSTRACT

A clock signal generator for generating clock signals to an integrated circuit. The clock signal generator comprises a delay-locked loop adapted to generate a plurality of mutually delayed clock phases based on a reference clock signal. The delay-locked loop is further adapted to select one of the plurality of clock phases as an output signal of the delay-locked loop in response to a first control signal, wherein said output signal is a first clock signal. The clock signal generator further comprises an inverter arranged to generate an inverse of the output signal and a multiplexer unit arranged to, in response to a clock-invert signal, forward either the output signal or the inverse of the output signal as a second clock signal.

6 Claims, 1 Drawing Sheet

CLOCK SIGNAL GENERATOR

CROSS-REFERENCE TO RELATED APPLICATION

This application is a continuation of PCT Application No. PCT/EP2007/050507, filed Jan. 18, 2007, which designates the United States, and for which priority is being claimed to European Patent Application No. 06110103.6, filed Feb. 17, 2006, the entire disclosures of which are hereby incorporated by reference.

TECHNICAL FIELD OF THE INVENTION

The present invention relates to a clock signal generator.

DESCRIPTION OF RELATED ART

Mixed-signal systems, i.e. systems that may include both analog and digital functionality, may be implemented e.g. on a single integrated circuit (IC). An IC including a mixed-signal system will herein be referred to as a mixed- signal IC. An analog part of the mixed signal IC may require a first clock signal for its operation. For example, the analog part may include at least one data converter, such as an analog-to-digital converter (ADC) or a digital-to-analog converter (DAC), and/or a discrete-time, analog filter such as a switched-capacitor (SC) filter or a switched-current (SI) filter, that may require the first clock signal for their operation, e.g. as a sampling clock. Further, a digital part of the mixed-signal IC may require a second clock signal for its operation. For example, the digital part may include a central processing unit (CPU), digital signal processor (DSP), finite state machine (FSM), etc., that require the second clock signal for their operation. The first and the second clock signal may have the same frequency.

It may be required that the second clock signal is synchronized with a reference clock signal. For example, it may be required that the second clock signal should be in phase with the reference clock signal. Alternatively, it may be required that the second clock signal has a given delay with respect to the reference clock signal. The reference clock signal may e.g. be generated with a reference clock generator which may at least in part be located off the mixed-signal IC, such as a crystal oscillator.

For flexibility reasons, it may be desirable to be able selectively invert the first clock signal with respect to the second clock signal. For example, an analog input signal of the mixed-signal IC may be generated by an external DAC. During a transition phase between two consecutive output values from the external DAC, unwanted transients e.g. in the form of ringing, overshoot, and glitches may be present in the analog input signal of the mixed-signal IC. The analog input signal of the mixed-signal IC may be sampled e.g. by an ADC within the analog part of the mixed-signal IC. The option of being able to selectively invert the first clock signal with respect to the second clock signal may then be used to avoid sampling the analog input signal of the mixed-signal IC during said transition phase.

SUMMARY OF THE INVENTION

It is an object of the present invention to provide a clock signal generator for flexible generation of clock signals in an integrated circuit.

According to a first aspect, a clock signal generator for generating clock signals to an integrated circuit comprises a delay-locked loop adapted to generate a plurality of mutually delayed clock phases based on a reference clock signal. The delay-locked loop is further adapted to select one of the plurality of clock phases as an output signal of the delay-locked loop in response to a first control signal, wherein said output signal is a first clock signal. The clock signal generator further comprises an inverter arranged to generate an inverse of the output signal and a multiplexer unit arranged to, in response to a clock-invert signal, forward either the output signal or the inverse of the output signal as a second clock signal.

The delay-locked loop may be adapted to generate the plurality of mutually delayed clock phases so that phase shifts of the plurality of mutually delayed clock phases with respect to the reference clock signal are evenly distributed in the range 0°-360° when the delay-locked loop is in a locked condition.

The first control signal may be a first control word. The clock signal generator may further include a control unit arranged to generate the first control word based on a second control word and the clock-invert signal.

The delay-locked loop may be adapted to select the output signal of the delay-locked loop among the plurality of clock phases so that an inversion of an MSB of the first control word results in a 180° phase shift in the output signal of the delay-locked loop.

The control unit may be adapted generate the MSB of the first control word as a copy of an MSB of the second control word when the clock-invert signal has a first value and as an inverse of the MSB of the second control word when the clock-invert signal has a second value.

The control unit may include an XOR gate adapted to generate the MSB of the first control word based on the MSB of the second control word and the clock-invert signal.

According to a second aspect, an integrated circuit comprises the clock signal generator.

According to a third aspect, an electronic apparatus comprises the clock signal generator. The electronic apparatus may be but is not limited to a monitor, a projector, a television set, or a radio transceiver. Further embodiments of the invention are defined in the dependent claims.

The first clock signal may e.g. be used for clocking of an analog block in a mixed-signal IC. The second clock signal may e.g. be used for clocking a digital block in the mixed signal IC. It is an advantage of some embodiments that the first clock signal may be generated with a relatively low amount of jitter while it is possible to invert the first clock signal with respect to the second clock signal. It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of the invention will appear from the following detailed description of the invention, reference being made to the accompanying drawings, in which.

DETAILED DESCRIPTION OF EMBODIMENTS

Figure 1:
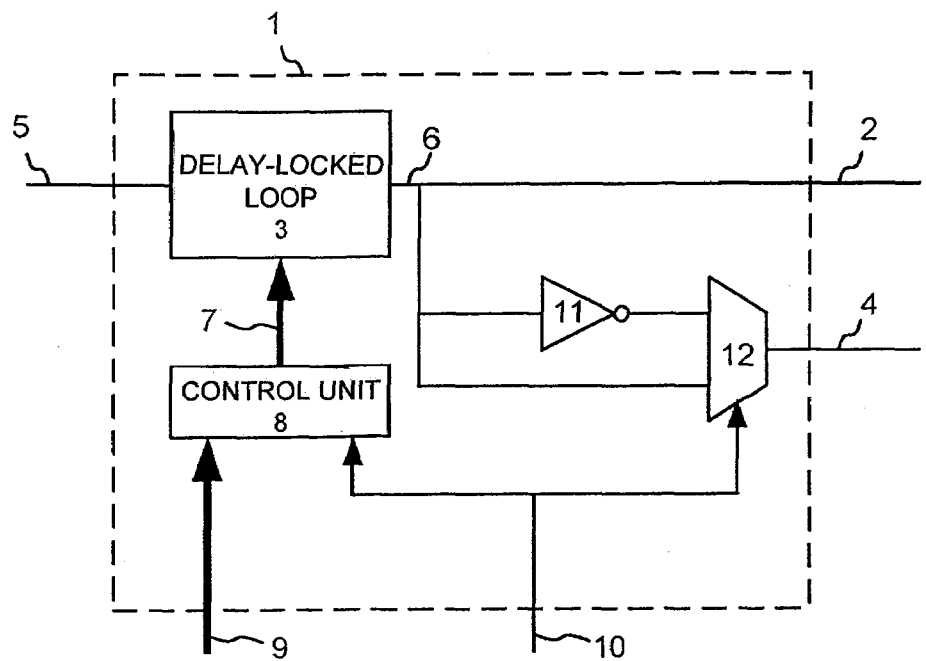
FIG. 1 is a circuit diagram of a clock-signal generator according to an embodiment.

FIG. 1 shows a circuit diagram of an embodiment of a clock signal generator 1 for flexible generation of clock signals in an integrated circuit (IC). The IC may e.g. be comprised in an electronic apparatus, such as but not limited to a monitor, a projector, a television set, or a radio transceiver. In the following, a mixed-signal IC, comprising both analog and digital units, will be considered. The clock signal generator 1 may, however, be used also in purely digital and purely analog ICs.

The clock signal generator 1 may be adapted to generate a first clock signal which may e.g. be used as a sampling clock in an analog part of the mixed signal IC and a second clock signal which may e.g. be used for controlling the operation of a digital part of the mixed-signal IC.

The first clock signal, which is generated on a first clock terminal 2 directly by a delay-locked loop (DLL) 3 and therefore may have a relatively low degree of clock jitter associated with it, may be used to control the operation of the analog part of the mixed-signal IC directly. Alternatively, clock-distribution circuitry, such as a single clock buffer or a network of clock buffers, may be connected between the first clock terminal 2 and the analog part of the mixed signal IC.

The second clock signal, which is generated on a second clock terminal 4 of the clock signal generator 1, may have a relatively high degree of clock-jitter associated with it compared with the first clock signal. This may be acceptable due to higher tolerance to clock jitter in the digital part. The second clock signal may be used to control the operation of the digital part of the mixed-signal IC directly. Alternatively, clock-distribution circuitry, such as a single clock buffer or a network of clock buffers, may be connected between the second clock terminal 4 and the digital part of the mixed signal IC, e.g. if the capacitive load that needs to be driven by the second clock signal is to large to be driven directly by the clock signal generator 1.

A reference clock signal may be supplied to the DLL 3 via a terminal 5 of the clock signal generator 1. The reference clock signal may e.g. be generated by a crystal. oscillator. Alternatively, the reference clock signal may be generated by a phase-locked loop (PLL). The PLL may be operatively connected to a crystal oscillator.

The DLL 3 may be adapted to generate a plurality of mutually delayed clock phases. The DLL 3 may further be adapted to select one of the plurality of mutually delayed clock phases as an output signal of the DLL 3 based on a first control word. The output signal of the DLL 3 may be generated on an output terminal 6 of the DLL 3. The first control word may e.g. have N bits, where N is an integer, such as but not limited to five. The number of clock phases in the plurality of mutually delayed clock phases may then be $2^N$. Each of the plurality of clock phases may have the same frequency as the reference clock signal. Phase shifts of the plurality of mutually delayed clock phases with respect to the reference clock signal may e.g. be evenly distributed in the range 0°-360° in a locked condition of the DLL 3. The first control word may be supplied to the DLL 3 via a bus 7 from a control unit 8.

The control unit 8 may be arranged to receive a second control word via an interface 9. The control unit 8 may further be arranged to receive a clock-invert signal from a control terminal 10 of the clock signal generator 1. The control unit 8 may be adapted to generate the first control word based on the second control word and the clock-invert signal. The second control word may be supplied to the clock signal generator 1 by a synchronization unit (not shown). The synchronization unit may be located internally on the mixed-signal IC or externally. The synchronization unit may be adapted to generate the second control word such that the second clock signal is synchronized with a clock signal of an external unit transmitting and/or receiving analog and/or digital information to and/or from the mixed signal IC. Alternatively or additionally, the synchronization unit may be adapted to generate and supply the clock-invert signal to the clock-signal generator 1.

The clock signal generator 1 may comprise an inverter 11. The inverter 11 may be connected to the output terminal 6 of the DLL 3 at an input terminal of the inverter 11. The inverter 11 may be adapted to generate an inverse of the output signal from the DLL 3. The clock signal generator 1 may further comprise a multiplexer unit 12. A first input terminal of the multiplexer unit 12 may be connected to the output terminal 6 of the DLL 3. Further, a second input terminal of the multiplexer unit 12 may be connected to an output terminal of the inverter 11. The control terminal 10 of the clock-signal generator may be connected to a select terminal of the multiplexer unit for supplying the clock- invert signal to the multiplexer unit 12. The multiplexer unit 12 may be arranged to selectively forward either the output signal from the DLL or the inverse of the output signal from the DLL to the second clock terminal 4 of the clock signal generator 1 in response to the clock-invert signal.

Thereby, the first clock signal may be the output signal of the DLL 3. The first clock signal may be supplied to the first clock terminal 2 of the clock signal generator 1 e.g. via a short circuit between said first clock terminal 2 and the output terminal 6 of the DLL 3.

The clock-invert signal may have one of two states or values, e.g. ˆ0' or ˆ1'. In an embodiment, the clock signal generator 1 may be adapted to invert the first clock signal with respect to the second clock signal when the clock-invert signal has the value ˆ1'. The clock signal generator 1 may further be adapted to generate the first clock signal in phase with the second clock signal when the clock-invert signal has the value ˆ0'.

The first control word and the second control word may have equally many bits. The control unit 8 may be adapted to generate the first control word as a copy of the second control word when the clock-invert signal has the value ˆ0'. The control unit 8 may further be adapted to generate the first control word as a copy of the second control word except for a most significant bit (MSB) of the first control word which may be generated as an inverse of an MSB of the second control word.

The DLL 3 may be arranged such that changing the value of the MSB of the first control word, either from ˆ0' to ˆ1' or vice versa, while keeping the values of the remaining bits of the first control word constant results in a 180° phase shift in the output signal of the DLL 3 when the DLL 3 is in a locked condition.

If the first clock signal and the second clock signal should be in phase with each other, the value of the clock- invert signal may be set to ˆ0'. The multiplexer unit may then be set to forward the output signal from the DLL 3 as the second clock signal to the second clock terminal 4 of the clock signal generator. The control unit 8 may generate the first control word as a copy of the second control word. The second control word may be chosen so that the second clock signal is in phase with the reference clock signal. Alternatively, the second control signal may be chosen so that the second clock signal has a given delay with respect to the reference clock signal.

Figure 2:
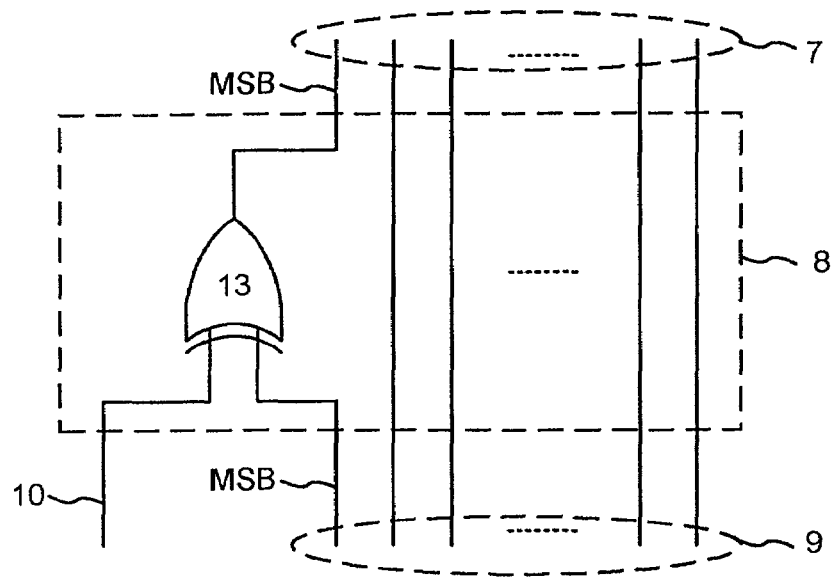
FIG. 2 is a circuit diagram of a control unit according to an embodiment.

If the first clock signal should be inverted with respect to the second clock signal, the value of the clock-invert signal may be changed from ˆ0' to ˆ1'. If the second control word is maintained at the same value as before, the MSB of the first control word will be inverted compared with the situation when the value of the clock-invert signal was set to ˆ0'. The remaining bits of the first control word will have the same value as before. Therefore, the output signal from the DLL 3 will be subject to a 180° phase shift, i.e. it will be inverted compared with the situation when the value of the clock-invert signal was set to ˆ0'. Since the first clock signal is the output from the DLL 3, the first clock signal will also be inverted compared with the situation when the value of the clock- invert signal was set to ˆ0'. However, the multiplexer unit 12 will now instead be set to forward the inverse of the output signal from the DLL 3 as the second clock signal to the second clock terminal 4 of the clock signal generator 1. Therefore, the phase of the second clock signal will be unaffected by the change of the value of the clock-invert signal, except for a delay introduced by the inverter 11. A circuit diagram of an embodiment of the control unit 8 is shown in FIG. 2. The control unit 8 may include an exclusive OR (XOR) gate 13. The XOR gate 13 may be adapted to generate the MSB of the first control word on an output terminal of the XOR gate. The MSB of the second control word and the clock-invert signal may be supplied to a first and a second input terminal of the XOR gate 13, respectively. The remaining bits of the first control word may be generated as copies of the corresponding bits of the second control word using short circuits between the input interface 9 and the bus 7.

In modern IC fabrication processes, a DLL with low associated jitter may be designed and fabricated. An advantage of the above described arrangement for generating the first and the second clock signal is that the first clock signal is generated directly by the DLL 3 and may therefore a have low degree of clock jitter associated with it. Units such as inverters and/or multiplexers inserted in the signal path of a clock signal may introduce additional jitter. Hence, with the above described arrangement, the second clock signal may have worse jitter associated with it than the output signal from the DLL 3. However, digital circuits normally have higher tolerance to clock jitter than analog circuits that use the clock signal as a sampling clock. Therefore, the jitter introduced by the inverter 11 and the multiplexer unit 12 may be acceptable to the digital part of the mixed-signal IC. It is a further advantage of the above described arrangement for generating the first and the second clock signals that both the first and the second clock signals are generated with a single clock-signal generator which may result in a smaller circuit area and lower power consumption than if e.g. separate clock-signal generators were used for generating the first and the second clock signal.

The present invention has been described above with reference to specific embodiments. However, other embodiments than the above described are possible within the scope of the invention. The different features of the invention may be combined in other combinations than those described. The scope of the invention is only limited by the appended patent claims.

The invention claimed is:

1. A clock signal generator for generating clock signals to an integrated circuit comprising:
    a delay-locked loop is configured to generate a plurality of mutually delayed clock phases based on a reference clock signal and to select one of the plurality of clock phases as an output signal of the delay-locked loop in response to a first control word, wherein said output signal is a first clock signal;
    an inverter arranged to generate an inverse of the output signal;
    a multiplexer unit arranged to, in response to a clock-invert signal, forward either the output signal or the inverse of the output signal as a second clock signal; wherein
    the delay-locked loop is configured to select the output signal of the delay-locked loop among the plurality of clock phases such an inversion of an MSB of the first control word results in a 180° phase shift in the output signal of the delay-locked loop;
    the clock-signal generator is configured to output both the first and the second clock signal; and in that
    the clock-signal generation unit comprises a control unit arranged to generate the first control word based on a second control word and the clock-invert signal, wherein the control unit is configured generate the MSB of the first control word as a copy of an MSB of the second control word when the clock-invert signal has a first value and as an inverse of the MSB of the second control word when the clock-invert signal has a second value.

2. The clock signal generator according to claim 1, wherein the delay-locked loop is configured to generate the plurality of mutually delayed clock phases so that phase shifts of the plurality of mutually delayed clock phases with respect to the reference clock signal are evenly distributed in the range 0°-360° when the delay-locked loop is in a locked condition.

3. The clock signal generator according to claim 1, wherein the control unit includes an XOR gate configured to generate the MSB of the first control word based on the MSB of the second control word and the clock-invert signal.

4. An integrated circuit comprising the clock signal generator according to claim 1.

5. An electronic apparatus comprising the clock signal generator according to claim 1.

6. The electronic apparatus according to claim 5, wherein the electronic apparatus is a monitor, a projector, a television set, or a radio transceiver.

* * * * *